US011131710B2

(12) United States Patent
Bernabe et al.

(10) Patent No.: US 11,131,710 B2
(45) Date of Patent: Sep. 28, 2021

(54) INTEGRATED PHOTONIC TEST CIRCUIT

(71) Applicant: Commissariat à l'Énergie Atomique et aux Énergies Alternatives, Paris (FR)

(72) Inventors: Stéphane Bernabe, Grenoble (FR); Philippe Grosse, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 42 days.

(21) Appl. No.: 16/691,328

(22) Filed: Nov. 21, 2019

(65) Prior Publication Data
US 2020/0174067 A1 Jun. 4, 2020

(30) Foreign Application Priority Data
Nov. 30, 2018 (FR) ...................... 1872180

(51) Int. Cl.
*G01R 31/309* (2006.01)
(52) U.S. Cl.
CPC .................. *G01R 31/309* (2013.01)
(58) Field of Classification Search
CPC .... G01R 1/071; G01R 31/26; G01R 31/2601; G01R 31/2851; G01R 31/308; G01R 31/311
See application file for complete search history.

(56) References Cited

U.S. PATENT DOCUMENTS

| 10,042,131 | B1* | 8/2018 | Lesea | G02B 6/124 |
| 2011/0279812 | A1 | 11/2011 | Masuda | |
| 2014/0043050 | A1* | 2/2014 | Stone | G01J 1/08 |
| | | | | 324/750.01 |
| 2015/0085903 | A1 | 3/2015 | Gundel et al. | |
| 2016/0216445 | A1 | 7/2016 | Thacker et al. | |
| 2018/0313718 | A1* | 11/2018 | Traverso | G02B 6/305 |

FOREIGN PATENT DOCUMENTS

| FR | 3 063 833 A1 | 9/2018 |
| JP | H01-287482 A1 | 11/1989 |

OTHER PUBLICATIONS

Preliminary Search Report for French Application No. 1872180, dated Jul. 25, 2019.
[No Author Listed] Probes Selection Guide. FormFactor. 2018:1-36.

* cited by examiner

*Primary Examiner* — Tung X Nguyen
(74) *Attorney, Agent, or Firm* — Wolf, Greenfield & Sacks, P.C.

(57) ABSTRACT

A photonic circuit testing device, including a photonic test chip including, on the side of a first surface of the chip: micropillars, each intended to be placed in contact with a corresponding electric connection pad of the photonic circuit; and first optical input/output ports, each intended to be optically coupled to a second corresponding optical input/output port of the photonic circuit.

18 Claims, 5 Drawing Sheets

INTEGRATED PHOTONIC TEST CIRCUIT

This application claims priority to French patent application number 18/72180, the content of which is hereby incorporated by reference in its entirety to the maximum extent allowable by law.

TECHNICAL BACKGROUND

The present disclosure generally concerns integrated photonic (optical and/or optoelectronic) circuits, and more particularly the testing of integrated photonic circuits.

PRIOR ART

Integrated photonic circuits are currently manufactured from a wafer of a semiconductor material, or semiconductor wafer, which is then sawn to obtain a plurality of individual chips. Before the sawing step, tests are performed to verify that the circuits are functional.

To test an integrated photonic circuit, optical and/or electric signals are supplied to inputs of the circuit. Corresponding optical and/or electric signals can be observed at outputs of the circuit to determine whether the circuit operation is that expected or not.

Due to the large number of inputs and of outputs of integrated photonic circuits, the testing of a photonic circuit is complex and long to implement.

SUMMARY

There is a need for device and/or a method for testing an integrated photonic circuit which overcomes all or part of the disadvantages of known integrated photonic circuit testing devices and/or methods.

An embodiment overcomes all or part of the disadvantages of known integrated photonic circuit testing devices and methods.

An embodiment provides a device for testing a photonic circuit, comprising a photonic test chip comprising, on the side of a first surface of the chip: micropillars, each intended to be placed in contact with a corresponding electric connection pad of the photonic circuit; and first optical input/output ports each intended to be optically coupled to a second corresponding optical input/output port of the photonic circuit.

According to an embodiment, a first vertical grating coupler forms one of the first ports.

According to an embodiment, said first coupler is intended to be optically coupled to a second vertical grating coupler forming one of the second ports.

According to an embodiment, the test chip comprises a source of a light signal.

According to an embodiment, the light source is optically coupled to at least one of the first ports via at least one waveguide of said test chip.

According to an embodiment, each of the first ports and of the second ports is a vertical grating coupler, a vertical illumination photodiode, or a vertical cavity surface-emitting laser diode.

According to an embodiment, the test chip comprises electric connection pads on the side of a second surface opposite to the first surface, and electrically-conductive through vias electrically coupling the micropillars to said pads.

According to an embodiment, the device further comprises a printed circuit board arranged on the side of the second surface of the test chip, the printed circuit board being electrically connected to the pads of the test chip.

According to an embodiment, the device comprises a processing circuit configured to deliver electric test signals and to receive electric signals representative of the result of the test.

According to an embodiment, the test chip comprises the processing circuit.

According to an embodiment, the device comprises an electronic chip comprising the processing circuit, wherein said electronic chip is interposed between the second surface of the test chip and the printed circuit board and is electrically connected to the pads of the test chip, or wherein said electronic chip is assembled on the printed circuit board and is coupled to the pads of the test chip via the printed circuit board.

According to an embodiment, the first ports and the micropillars are arranged based on the positions of the second ports and of the connection pads of the photonic circuit, so that when the micropillars are in contact with the pads of the photonic circuit, the first ports are optically coupled to the second ports.

According to an embodiment, the micropillars have a height in the range from 5 to 20 µm, a diameter in the range from 5 to 20 µm, and are preferably coated with a resilient material such as gold.

Another embodiment provides a method comprising the steps of: a) providing a test device such as defined hereabove and a photonic circuit to be tested with said device, the photonic circuit comprising a second output port and a second input port connected to the respective ends of a waveguide of the photonic circuit, the test chip comprising a first output port intended to be optically coupled to the second input port and a first input port intended to be coupled to the second output port; b) placing the first surface of the test chip opposite a surface of the photonic circuit having the second ports arranged on its side; and c) maximizing a quantity of light transmitted from the first output port to the first input portion via the second input port, the waveguide, and the second output port.

According to an embodiment, the method further comprises, between steps b) and c), a step of making the first surface of the chip and said surface of the photonic circuit parallel.

The foregoing and other features and advantages will be discussed in detail in the following non-limiting description of specific embodiments in connection with the accompanying drawings.

DESCRIPTION OF THE EMBODIMENTS

Figure 1:
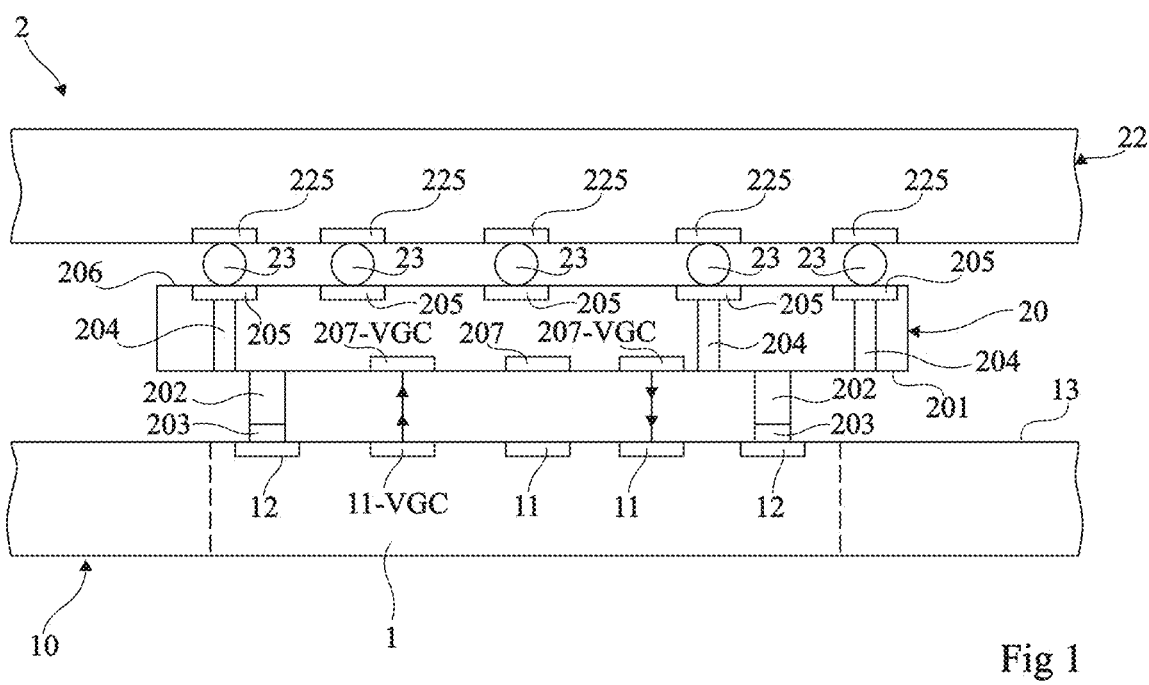
FIG. 1 very schematically shows in cross-section view an embodiment of an integrated photonic circuit and an embodiment of a device for testing the integrated photonic circuit.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the manufacturing, the operation, and the testing (selection of the optical and electrical test signals and interpretation of the corresponding output signals) of the photonic integrated circuits have not been detailed, the described embodiments being compatible with usual photonic integrated circuits.

Throughout the present disclosure, the term (electrically or optically) "connected" is used to designate a direct electrical or optical connection between circuit elements, whereas the term (electrically or optically) "coupled" is used to designate an electrical or optical connection between circuit elements that may be direct, or may be via one or more other elements. Further, unless otherwise specified, when reference is made to two optical input/output ports optically coupled together, this means that the input/output ports are arranged so that an optical signal may pass from one to the other of the ports, otherwise than by evanescent coupling or near-field coupling, and the distance between the ports thus coupled may then be greater than one or a plurality of times the wavelength of the optical signal.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 very schematically shows in cross-section view an embodiment of an integrated photonic circuit 1 and an embodiment of a device 2 for testing circuit 1.

Test device 2 comprises a photonic integrated circuit chip 20. Chip 20 comprises, on the side of its lower surface 201, electrically-conductive micropillars 202, for example, made of copper, each intended to receive an electric output signal from circuit 1 or to deliver an electric input signal to circuit 1. As an example, each electric input signal of circuit 1 is an electric power supply signal or an electric control and/or test signal. Preferably, each micropillar 202 comprises a resilient conductive material 203, for example, gold, coating micropillar 202 on the side opposite to surface 201. In other words, the end of the micropillar opposite to surface 201 is preferably made of material 203.

Preferably, in this embodiment, each micropillar 202 has a height in the range from 5 to 20 µm, the height of a micropillar being for example measured perpendicularly to surface 201. As can be seen in FIG. 1 and as can be for example understood from the following description, micropillars 202 preferably all have the same height, for example, measured from surface 201, perpendicularly thereto. In other words, the ends opposite to the surface 201 of all micropillars 202 are comprised in a same plane parallel to surface 201 of chip 20. Preferably, in this embodiment, each micropillar 202 has a maximum lateral dimension, for example, the diameter for a substantially cylindrical micropillar 202, in the range from 5 to 20 µm, this lateral dimension being for example measured in a plane parallel to surface 201. Preferably, the height (or thickness) of material 203 is in the range from 2 to 10 µm, preferably smaller than 5 µm in the case of gold.

Chip 20 comprises electrically-conductive vias 204, for example, made of copper, crossing all or part of the thickness of chip 20. Chip 20 further comprises electric connection pads 205 arranged on the side of its upper surface 206. Vias 204, currently designated with initials TSV (Through Silicon Via), electrically couple pads 205 to micropillars 202 and, possibly, to electronic and/or optoelectronic components arranged on the side of surface 201 of chip 20. Although this is not shown in FIG. 1, preferably chip 20 comprises, on the side of its surface 201, an interconnection structure comprising at least one metal level to electrically connect vias 204 to micropillars 202 and, possibly, to electronic and/or optoelectronic components arranged on the side of this surface 201. Similarly, preferably, chip 20 comprises, on its upper surface side 206, an interconnection structure comprising at least one metal level to electrically connect vias 204 to pads 205. As an example, the thickness of chip 20, for example measured in a direction orthogonal to surfaces 201 and 206, is in the range from 80 to 200 µm, for example, in the order of 100 µm.

Chip 20 further comprises, on the side of its lower surface 201, optical input/output ports 207. Preferably, at least one port 207, designated with reference 207-VGC hereafter, is a vertical grating coupler (VGC). As can be seen in FIG. 1 and can be for example understood in the following description, all optical ports 207-VGC belong to a same plane parallel to surface 201. The operation of a vertical grating coupler is based on diffraction phenomena. As an example, a vertical grating coupler occupies a surface area of approximately 20 µm by approximately 30 µm when the received or emitted light beam has a diameter in the order of 10 µm.

In this example, chip 20 comprises an optical input port 207-VGC (on the left-hand side of FIG. 1) and an optical output port 207-VGC (on the right-hand side of FIG. 1).

Input port 207-VGC is configured to receive an optical signal in the form of a light beam (represented by arrows in FIG. 1) propagating towards port 207-VGC, in a direction orthogonal or substantially orthogonal to surface 201, for example, with an angle relative to the normal to surface 201 in the range from 0 to 45°, preferably in the range from 0 to 15°, for example, equal to 8°. Although this is not shown in FIG. 1, preferably, input port 207-VGC is optically coupled to a photodiode of chip 20, for example, via a waveguide of chip 20. Thus, an optical signal received by input port 207-VGC of chip 20 may be converted into a corresponding electric signal by the photodiode.

Output port 207-VGC is configured to emit an optical signal in the form of a light beam (represented by arrows in FIG. 1) propagating from output port 207-VGC, in a direction orthogonal or substantially orthogonal to surface 201, for example, with an angle relative to the normal to surface 201 in the range from 0 to 45°, preferably in the range from 0 to 15°, for example, equal to 8°. Although this is not shown in FIG. 1, output port 207-VGC is optically coupled to a light source of chip 20, for example, a laser, for example, via a waveguide of chip 20. Thus, an optical signal emitted by output port 207-VGC of chip 20 may be supplied by the integrated light source to chip 20.

Chip 20 may comprise optical input/output ports other than vertical grating couplers. For example, at least one optical input port 207 may be a vertical illumination photodiode and/or at least one output optical port 207 may be a light source, for example, a vertical cavity surface-emitting laser (VCSEL) diode, delivering a light beam propagating in a direction substantially perpendicular to surface 201.

In the described embodiment, chip 20 thus comprises at least one integrated light source, for example, a VCSEL diode directly used as an optical output port 207 and/or a laser optical coupled to a vertical grating coupler used as an optical output port 207-VGC, for example, a DBR-type (Distributed Bragg Reflector) laser or a DFB-type (Distributed FeedBack) laser, for example, a laser comprising III-V materials located in the insulating layers of the interconnection structure on the side of surface 201, under the upper metal level in contact with micropillars 202, and a waveguide located under the interconnection structure.

Preferably, as shown in FIG. 1, test device 2 comprises a printed circuit board 22, for example, an organic or ceramic substrate provided with an electric interconnection network, having chip 20 assembled thereon. More particularly, pads 205 of chip 20 are electrically connected to electric connection pads 225 of board 22, here arranged on the side of lower surface 221 of board 22. Preferably, for each pair of pads 205 and 225 electrically connected to each other, pad 205 is located opposite pad 225. The electric connection between a pad 205 and a pad 225 is for example ensured by direct contact between the two pads or via an electric connection element 23, for example, a metal ball or a metal pillar, extending from pad 225 to pad 205. As an example, an electric connection element 23 may be made of an alloy of tin, copper, and silver. As shown in FIG. 1, connection elements 23 may not be vertically in line with a via 204, and be electrically connected to these vias due to an interconnection structure (not shown) formed on the side of surface 206 of chip 20.

Board 22 supplies the electric power to chip 20. Board 22 may also supply chip 20 with electric control and/or test signals, for example, signals from which chip 20 generates electric and/or optical signals for controlling and/or testing circuit 1. Board 22 may also receive from chip 20 electric signals representative of electric and/or optical signals received by chip 20 from circuit 1, that is, signals representative of the result of a test of circuit 1.

In FIG. 1, integrated photonic circuit 1 forms part of a semiconductor wafer 10 comprising a plurality of integrated photonic circuits (delimited by dotted lines in FIG. 1), for example, a plurality of circuits 1. Although this has not been shown in FIG. 1, wafer 10 rests on a mobile table of a test station (not shown), the assembly of board 22 and of chip 20 being supported by a mobile arm of test station 2, preferably a mobile arm provided with a ball joint enabling, if need be, to compensate unevennesses of surfaces 201 and/or 13, for example, by inclining the plane of surface 201 with respect to the plane of surface 13. Preferably, the test station forms part of test device 2. Just before or during a test phase, each optical port 207 of chip 20 is optically coupled to a corresponding optical port 11 of circuit 1, and each micropillar 202 of chip 20 is in physical contact with a corresponding electric connection pad 12 of circuit 1, so that micropillar 202 and pad 12 are electrically connected.

Electric connection pads 12 are arranged on the side of upper surface 13 of circuit 1, that is, the upper surface 13 of wafer 10. As shown in FIG. 1 and as can for example be understood from the following description, pads 12 are preferably arranged in a same plane parallel to surface 13 of the circuit to be tested 1. In other words, the exposed surfaces of pads 12 are all arranged in a same plane parallel to surface 13 of the circuit to be tested 10. Each pad 12 is intended to receive an electric input signal of circuit 1 or of delivering an electric output signal of circuit 1. As an example, each electric input signal of the circuit is an electric power supply signal or an electric control and/or test signal. Although this is not shown in FIG. 1, preferably, circuit 1 comprises, on the side of its surface 13, an interconnection structure comprising at least one metal level, to electrically connect pads 12 to active (optoelectronic and/or electronic) components arranged on the side of this surface 13.

As an example, for the previously-indicated examples of micropillar dimensions, the surface area of each pad 12 is smaller than 25 µm*25 µm, preferably smaller than 15 µm*15 µm, for example in the order of 5 µm*5 µm, preferably equal to 5 µm*5 µm.

The input/output optical ports 11 of circuit 1 are also arranged on the side of upper surface 13 of circuit 1. Preferably, at least one port 11 is a vertical grating coupler, designated with reference 11-VGC in the following description. Each optical port 11-VGC may be an input port or an output port of circuit 1. Preferably, during a test phase of circuit 1, at least one port 11-VGC is optically coupled to a port 207-VGC as shown on the left-hand side of FIG. 1 or, in other words, at least one port 207-VGC is intended to be optically coupled to a port 11-VGC. Preferably, all optical ports 11-VGC belong to a same plane parallel to surface 13 of circuit 1.

Circuit 1 may comprise optical input/output ports 11 other than vertical grating couplers. For example, at least one optical input port of circuit 1 may be a vertical illumination photodiode and/or at least one output optical port of circuit 1 may be a light source, for example, a VCSEL diode, supplying a light beam directed substantially perpendicular to surface 13.

In the embodiment of FIG. 1, the use of micropillars 202 to exchange electric signals between chip 20 and circuit 1 enables pads 12 to have smaller dimensions than if the signals had been exchanged via test probe points in physical and electric contact with pads 12.

Further, the use of micropillars 202 enables, during the test, surfaces 201 and 13 opposite each other to be sufficiently close for the optical ports 207 of chip 20 to be optically coupled to the optical ports 11 of the circuit without using complex light focusing and/or directing optical devices such as prisms or lenses. This is particularly true in the coupling of a port 207-VGC with a port 12-VGC, such a coupling being for example capable of occurring all the way to a distance of approximately 100 µm between the two ports, although a distance shorter than or equal to approximately 20 µm, compatible with the height of micropillars 202, is preferred to limit losses due to the divergence of the beam propagating between the two ports. Preferably, the distance between the plane comprising optical port(s) 207 and the plane comprising the ends of micropillars 202 opposite to surface 201 is shorter than or equal to 100 µm, or even shorter than or equal to 20 µm. Similarly, the distance between the plane comprising optical port(s) 11-VGC and the plane comprising pads 203 is shorter than or equal to 5 µm, or even to 1 µm. Although the height of micropillars 202 makes an evanescent coupling or near-field coupling between two ports 207 and 11 difficult or even impossible, this is not disturbing since this type of optical coupling is not that which is used herein.

In the described embodiment, the provision of at least one light source integrated to chip 20 enables to supply circuit 1 with input optical signals without using a light source outer to chip 20 which would be optically coupled to chip 20 via an optical fiber. This thus enables to do away with a complex step of bonding a fiber to chip 20 and/or of alignment of an end of a fiber with an optical port of chip 20, typically a monomode polarization maintaining fiber. Further, the diameter of an optical fiber being currently greater than 80 µm, or even to 125 µm, the space available between surfaces 201 and 13 during a test phase of circuit 1 does not enable to place the end of such an optical fiber opposite an optical portion of chip 20 arranged on the side of its surface 201, the provision of printed circuit board 22 does not enable to place the end of such an optical fiber opposite an optical port of chip 20 arranged on the side of its upper surface 206, and the space available between surfaces 13 and 201 during a circuit test phase makes it difficult, or even impossible, to place the end of such an optical fiber opposite an optical portion of chip 20 which would be arranged on a lateral surface of chip 20 (butt coupling).

The provision of vias 204 enables electric signals, particularly the electric power supply of chip 20, to be delivered to chip 20 on the side of its surface 206. Vias 204 also enable, if need be, electric signals, for example representative of a test of circuit 1, to be delivered by chip 20 on the side of its surface 206 at the level of pads 205. It could have been devised to exchange the electric signals with chip 20 via conductive wires directly connected to metal pads arranged on the side of surface 201 of chip 20 (wire bonding). However, this would have been difficult or even impossible to implement, due to the small space available between surfaces 201 and 13 during a test phase.

Figure 2:
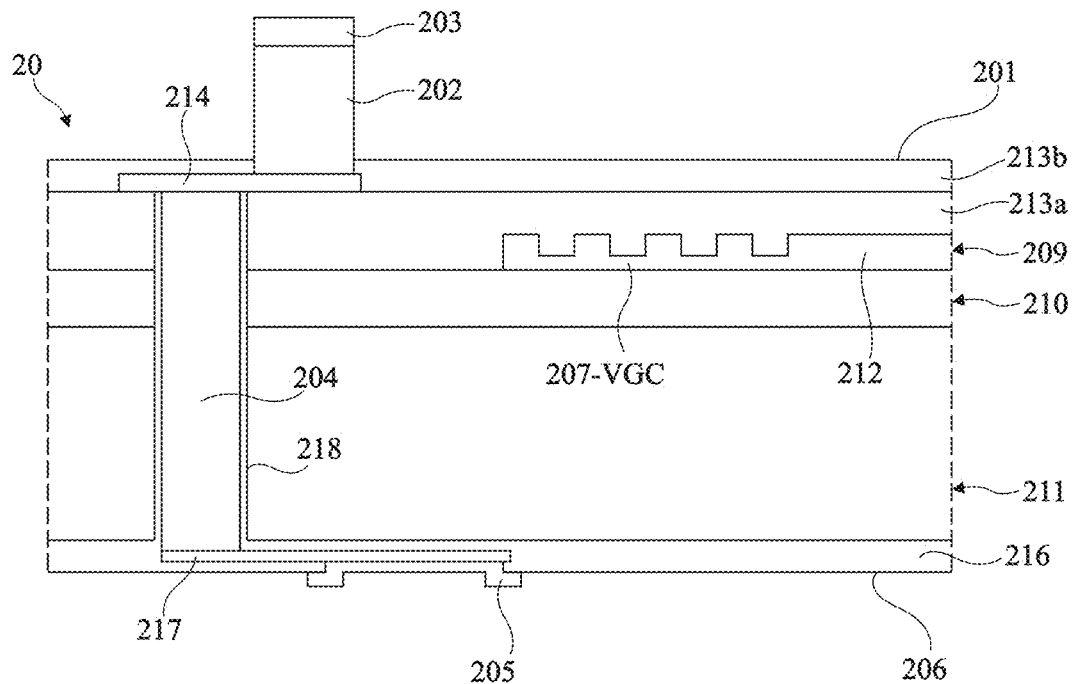
FIG. 2 is a more detailed simplified cross-section view of a portion of the test device of FIG. 1 according to an embodiment.

FIG. 2 is a more detailed simplified cross-section view of a portion of chip 20 of the test device 2 of FIG. 1, according to an embodiment. As compared with FIG. 1, chip 20 has been flipped, surfaces 201 and 206 of chip 20 respectively corresponding to the upper and lower surfaces of chip 20 in FIG. 2.

In this embodiment, chip 20 comprises a silicon layer 209 resting on an insulating layer 210, for example, made of silicon oxide, itself resting on a semiconductor substrate 211, for example, made of silicon. Layer 209 is said to be of SOI (Silicon On Insulator) type.

Various integrated photonic (optical and optoelectronic) and, possibly, electronic, elements are formed inside and/or on top of layer 209. As an example, these elements may be lasers, photodiodes, couplers, separators, modulators, waveguides, vertical grating couplers, etc. In the example of FIG. 2, an optical port 207-VGC and a waveguide 212 are defined in layer 209, port 207-VGC being arranged at an end of waveguide 212. The forming of these various elements by masking, etching, doping, etc. steps of layer 209 is within the abilities of those skilled in the art. Preferably, all the optical ports 207-VGC are defined in layer 209. In other words, all optical ports 207-VGC belong to a same plane parallel to surface 201 of chip 20.

Layer 209 is coated with one or a plurality of insulating layers 213, in the present example, a silicon oxide layer 213a covering layer 209 and a silicon nitride layer 213b resting on layer 213a. Layers 210 and 213a, preferably made of the same material, form a medium having a smaller refraction index than that of the silicon of layer 209, and play the role of an optical sheath of small index. Metal layer portions 214, embedded in insulating layers 213, form the interconnection structure on the side of surface 201 of chip 20. In this example, the interconnection structure comprises a single metal level formed of the portions of metal layer 214 resting on insulating layer 213a and covered with insulating layer 213b. In the example shown in FIG. 2, a micropillar 202 rests on a portion of metal layer 214, itself in contact with a via 204, micropillar 202 and via 204 being thus electrically connected to each other. Further, although this is not shown in FIG. 2, a portion of metal layer 214 of the interconnection structure may be electrically connected to an active component of layer 209, via a conductive via extending from this metal layer portion 214 to a connection terminal of the component formed on top of and/or inside of layer 209.

Chip 20 comprises, on the side of its surface 206, one or a plurality of insulating layers 216 resting on the surface of substrate 211 opposite to layer 209. Portions of metal layer 217 embedded in insulating layers 216 form the interconnection structure on the side of surface 206 of chip 20. In this example, the interconnection structure comprises a single metal level formed of metal layer portions 217.

Each pad 205, a single pad 205 being shown in FIG. 2, is formed at the level of the free surface of the interconnection structure arranged on the side of surface 206 and is at least partly in contact with metal layer portion 217 to be electrically connected to a via 204. As an example, layer 217 is made of copper or of aluminum, pads 205 in contact with layer 217 being for example made of aluminum.

As a variation, a pad 205 may correspond to a portion of a metal layer portion 217 having an exposed surface.

As shown in FIG. 2, through conductive via 204 is preferably laterally surrounded with an insulating sheath 218 electrically insulating it from substrate 211 and, possibly, from layer 209.

In alternative embodiments, not shown, the number and/or the materials of insulating layers 213, 216, the number of metal levels of each interconnection structure of chip 20, and the layout of at least certain optical and/or optoelectronic components (waveguide, vertical grating coupler, etc.) may be adapted by those skilled in the art. In particular, it may be provided for the interconnection structure on the side of surface 201 of chip 20 to comprise more than one metal level coupled together by conductive vias crossing insulating layers of the interconnection structure. In this case, it may be provided for waveguides and/or vertical grating couplers, for example, made of silicon nitride embedded in silicon oxide, to be directly formed in the insulating layers of the interconnection structure. In this case, a laser comprising, on the one hand, quantum wells made of III-V materials arranged in insulating layers of the interconnection structure interposed between layer 213a and 213b and, on the other hand, a waveguide and one or a plurality of Bragg gratings at least partly located in layer 209, may also be provided.

Figure 3:
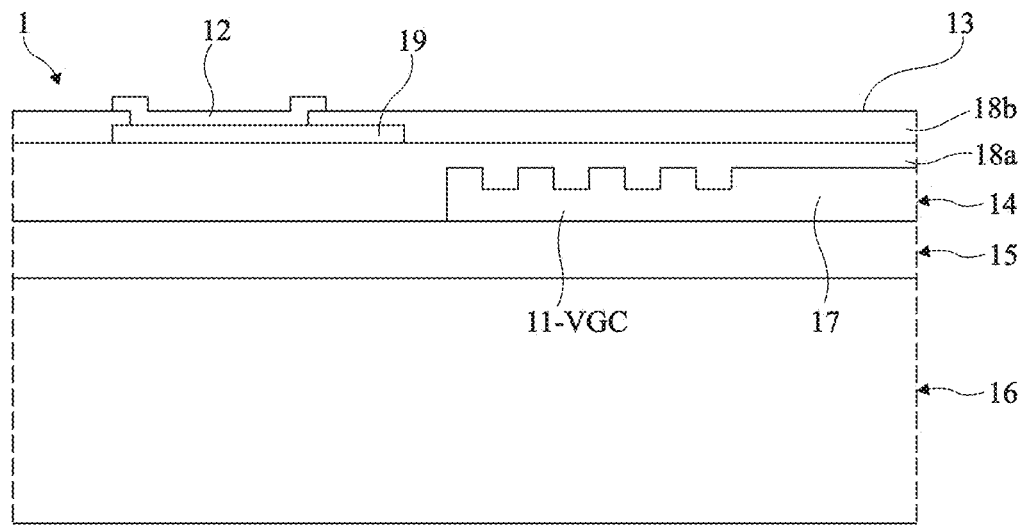
FIG. 3 is a more detailed simplified cross-section view of a portion of the photonic circuit of FIG. 1 according to an embodiment.

FIG. 3 is a more detailed simplified cross-section view of a portion of the photonic circuit 1 of FIG. 1, according to an embodiment.

In this embodiment, circuit 1 comprises a silicon layer 14 resting on an insulating layer 15, for example, made of silicon oxide, itself resting on a semiconductor substrate 16, for example, made of silicon, layer 14 being said to be of SOI type.

Similarly to what has been described in relation with FIG. 2, various photonic integrated (optical and optoelectronic) and, possibly, electronic, elements are formed inside and/or on top of layer 14. In the example of FIG. 3, an optical portion 11-VGC and a waveguide 17 are defined in layer 14, portion 11-VGC being arranged at an end of waveguide 17. Preferably, all the optical portions 11-VGC are defined in layer 14. In other words, all the optical ports 11-VGC belong to a same plane parallel to surface 13 of circuit 1.

Layer 14 is coated with one or a plurality of insulating layers 18, in the present example a silicon oxide layer 18a covering layer 14 and a silicon nitride layer 18b resting on layer 18a. Metal layer portions 19 embedded in insulating layers 18 form the interconnection structure. In the present example, the interconnection structure comprises a single metal level formed of the metal layer portions 19 resting on insulating layer 18a and covered with insulating layer 18b.

Each pad 12, a single pad 12 being shown in FIG. 3, is formed at the level of the free surface of the interconnection structure arranged on the side of surface 13 and is at least partly on top of and in contact with a metal layer portion 19 to be electrically connected to active (optoelectronic and/or electronic) components formed inside and/or on top of layer 14. For example, although this is not shown in FIG. 3, metal layer portion 19 in contact with pad 12 is coupled to an electric connection terminal of an active component of circuit 1 via a conductive via extending from metal layer portion 19 to the connection terminal. As an example, layer 19 is made of copper or of aluminum, pad 12 arranged on top of and in contact with layer 19 being for example made of aluminum.

As a variation, a metal pad 12 may correspond to a portion of a metal layer portion 19 having an exposed surface.

Similarly to chip 20, circuit 1 may be adapted by those skilled in the art, particularly as concerns the number and/or the materials of the insulating layers and/or of the metal levels of the interconnection structure, or also as concerns the layout of the components of circuit 1 such as waveguides, vertical grating couplers, or lasers.

Figure 4:
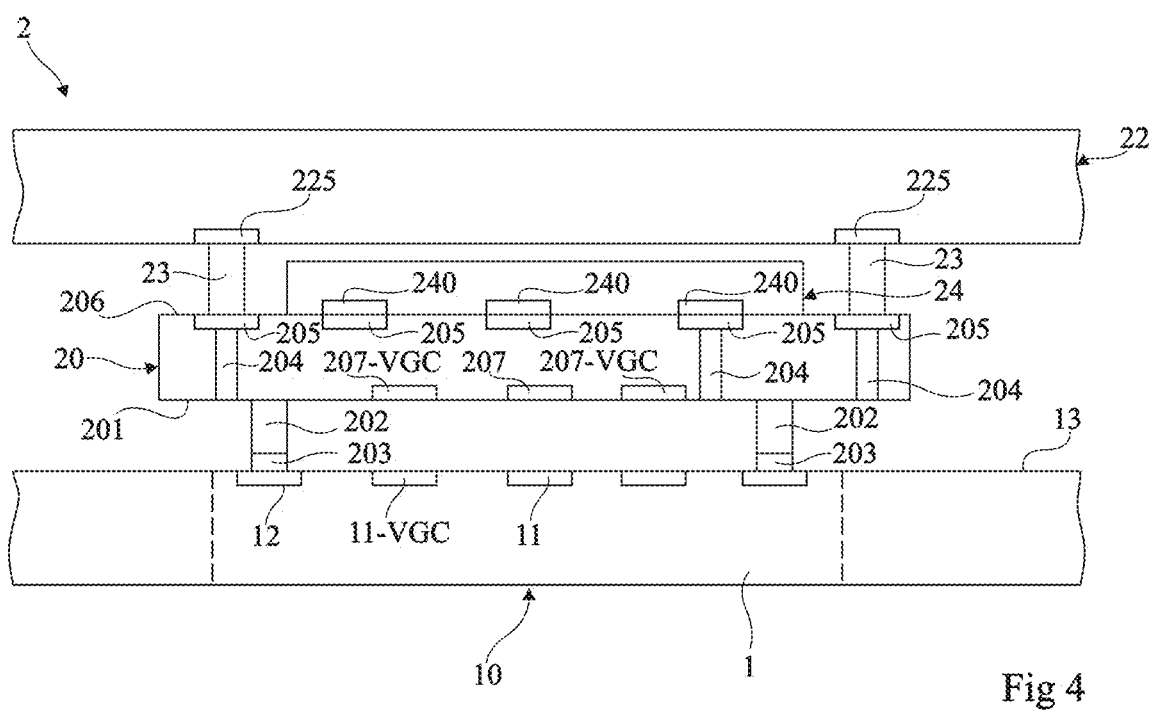
FIG. 4 is a simplified cross-section view showing an alternative embodiment of the test device of FIG. 1.

FIG. 4 is a simplified cross-section view showing an alternative embodiment of the test device of FIG. 1.

In this variation, it is provided for chip 20 to be associated with an electronic integrated circuit chip 24. Electronic chip 24 enables to perform logic operations on electric signals that it receives from chip 20 and/or enables to deliver test signals, or test vector, to chip 20 to implement a test of circuit 1. As an example, chip 24 is a dedicated chip (ASIC) or a configurable or programmable chip, for example, of FPGA type.

Thus, in the alternative embodiment of FIG. 4, device 2 differs from that of FIG. 1 only in that it comprises chip 24.

Chip 24 is here arranged on the side of upper surface 206 of chip 20. Connection elements 23, here electrically-conductive pillars, are selected to allow such a layout.

Chip 24 is electrically connected to chip 20. More particularly, in the shown example, chip 24 comprises electric connection pads 240 arranged on the side of its lower surface 241, each pad 240 being connected to a corresponding pad 205. In this example, each pad 240 is connected to a pad 205 by direct contact. As a variation, electric connection elements, for example, conductive balls or conductive pillars, may be provided between pads 240 and the corresponding pads 205.

In this alternative embodiment, chip 24 is electrically powered by chip 20, itself electrically powered by board 22.

In another alternative embodiment, not illustrated, chip 24 is assembled on printed circuit board 22 rather than on chip 20 as shown in FIG. 4. Chip 24 is then electrically coupled to chip 20 via board 22. In this other variation, chip 24 may be directly electrically powered by board 22.

It should be noted that the alternative embodiment of FIG. 4 enables, as compared with the case where chip 24 is assembled on board 22, to decrease the length of the electric paths followed by the electric signals exchanged between chips 20 and 24, which is particularly advantageous when the signals are high-frequency signals, that is, at frequencies greater than 10 GHz.

The provision of chip 24 associated with chip 20 enables to locally control chip 20 so that it delivers the (optical and/or electric) test signals to circuit 1. The provision of chip 24 associated with chip 20 also enables, when chip 20 receives the (optical and/or electric) output signals of circuit 1, the received optical signals being possibly converted into electric signals by chip 20, to process the electric signals to determine whether circuit 1 operates properly or not.

For example, the case where circuit 1 comprises a laser and an electro-optical modulator is considered. During a test phase of circuit 1, chip 20 electrically powers circuit 1, and in particular the laser of circuit 1, via the electric connection between micropillars 202 of chip 20 and pads 12 of circuit 1. Further, chip 20 delivers one or a plurality of electric test signals, and in particular a signal for controlling the modulator of circuit 1, still via the electric connection between micropillars 202 and pads 12. The modulated laser signal is transmitted by circuit 1, for example, by an optical output port 11-VGC, towards a corresponding optical port 207 of chip 20, for example, a vertical illumination photodiode or a vertical grating coupler 207-VGC optically coupled to a photodiode. The electric output signal of the photodiode is then delivered to chip 24, either directly when chip 24 is assembled on chip 20, or via board 22 when chip 24 is assembled on the board. Chip 24 then deduces therefrom whether the operation of the assembly of the laser and of the modulator of circuit 1 is correct or not.

In another alternative embodiment, not illustrated, it may be provided for chip 20 to comprise an electronic circuit implementing the functions of chip 24, and chip 24 may then be omitted.

In still another alternative embodiment, not illustrated, chip 20 transmits to the test station, for example, to a processing unit of the test station, information representative of the signals that it receives from circuit 1, and the test station then determines, based on this information, whether the circuit is functional.

To exchange information with the test station, for example, information representative of the result of a test of circuit 1, the assembly of chip 20 and of board 22, possibly provided with chip 24, may use a wire bonding, for example, to a bus connected between board 22 and the test station. As a variation, the information may be exchanged over a wireless connection, board 22, chip 20, and/or chip 24 being then provided with antennas to ensure such a wireless connection.

Figure 5:
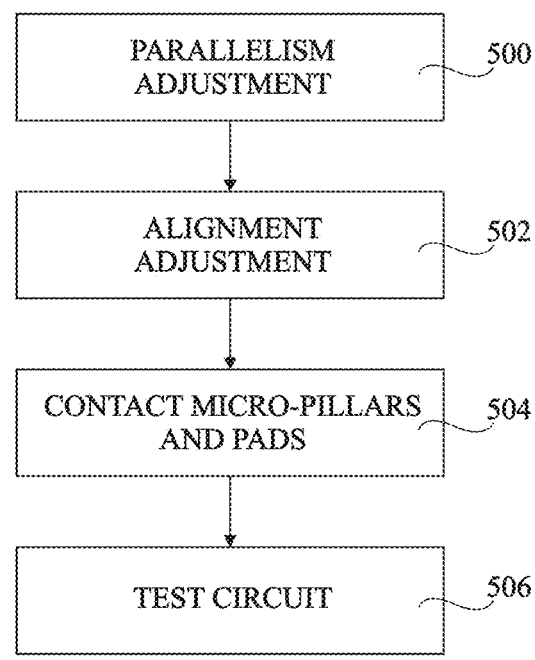
FIG. 5 schematically illustrates in the form of blocks an embodiment of a method of testing the circuit of FIG. 1 with the device of FIG. 1 or 4.

FIG. 5 schematically illustrates in the form of blocks an embodiment of a method for testing circuit 1 with device 2.

As a first step 500 (PARALLELISM ADJUSTMENT), wafer 10 is arranged on the mobile table of the test station of device 2, and the assembly of board 22 and of chip 20, possibly provided with chip 24, is arranged on a mobile arm of the test station so that surface 201 of chip 20 is opposite surface 13 of wafer 10. Surface 201 is made parallel to surface 13 by the displacing with respect to each other of the table and of the arm of the test station. As an example, such a parallelism adjustment is implemented by means of the method described in French patent application N°3063833.

This step may be automatically implemented by device 2, for example, due to instructions stored in a memory of the test station which, when they are read by the test station, for example, by a processing unit of the test station, cause the implementation of step 500. For example, the test station may receive signals representative of the current orientation of surface 201 relative to surface 13, and deduce therefrom signals for controlling the displacement relative to each other of the table and of the arm of the test station until surfaces 201 and 13 are parallel to each other.

At a next step 502 (ALIGNMENT ADJUSTMENT), chip 20 and circuit 1 are aligned, that is, placed opposite each other so that each micropillar 202 of chip 20 is opposite a corresponding pad 12 of circuit 1 and so that each optical port 207 is aligned with a corresponding optical port 11, possibly taking into account the angle with which an optical signal is transmitted from one to the other of the ports. To achieve this, the arm and the mobile table of the test station are for example displaced with respect to each other in directions parallel to surfaces 201 and 13, and possibly rotated around an axis orthogonal to surfaces 201 and 13. An embodiment of such a step will be described in relation with FIG. 6.

This step may be automatically implemented by device 2, for example, due to instructions stored in a memory of the test station which, when they are read by the test station, for example, by a processing unit of the test station, cause the implementation of step 502. For example, the test station may receive signals representative of the current orientation of surface 201 relative to surface 13, and deduce therefrom signals for controlling the displacement relative to each other of the table and of the arm of the test station until chip 20 and circuit 1 are aligned.

At a next step 504 (CONTACT MICRO-PILLARS AND PADS), surfaces 201 and 13 are brought closer to each other, without modifying the parallelism between these surfaces, until each micropillar 202 is in contact with a corresponding pad 12. During this step, material 203 and/or the ball joint of the mobile arm of the station enable to compensate for possible unevennesses of surfaces 201 and 13. Once micropillars 202 are in contact with the corresponding pads 12, the optical ports 207 are optically coupled to the corresponding optical ports 11.

This step may be automatically implemented by device 2, for example, due to instructions stored in a memory of the test station which, when they are read by the test station, for example, by a processing unit of the test station, cause the implementation of step 504. For example, the test station may receive signals representative of the current orientation of surface 201 as compared with surface 13, and deduce therefrom signals for controlling the displacement relative to each other of the table and of the arm of the test station until micropillars 202 are in contact with the corresponding pads 12.

At a next step 506 (TEST CIRCUIT), circuit 1 is tested due to the electric power supply and to the optical and/or electric signals that it receives from chip 20. Chip 20 receives in return the optical and/or electric output signals of circuit 1. Based on these output signals of circuit 1, chip 24, chip 20, and/or the test station, according to cases, determine whether circuit 1 is functional.

This step may be automatically implemented by device 2, for example, due to instructions stored in a memory of the test station and/or in a memory of chip 24 and/or in a memory of chip 20 which, when they are read by a processing unit of the test station and/or of chip 22 and/or of chip 24, cause the implementation of step 506.

Steps 502 to 506 may be repeated to test each circuit 1 of wafer 10. In particular, once step 502 has been implemented for a first time for a first circuit 1 of the wafer, during subsequent steps 502, the alignment of chip 20 with another circuit 1 may be performed based on a known offset between this other circuit and the first tested circuit, for example, by displacing chip 20 and wafer 10 with respect to each other based on this offset, preferably only in directions parallel and orthogonal to the planes of surfaces 201 and 13, that is, without modifying the inclination of surfaces 201 and 13 with respect to each other.

Further, although this is not illustrated herein, prior steps of design and of manufacturing of chip 20 and, possibly, of board 22 and/or of chip 24, as well as a step of assembly of elements 20, 22, and 24 are provided. It will be within the abilities of those skilled in the art to implement these steps, in particular, it will be within the abilities of those skilled in the art to determine the position of micropillars 202 and of the optical portions 207 of chip 20 based on the known position of pads 12 and of the optical pads 11 of circuit 1.

Figure 6:
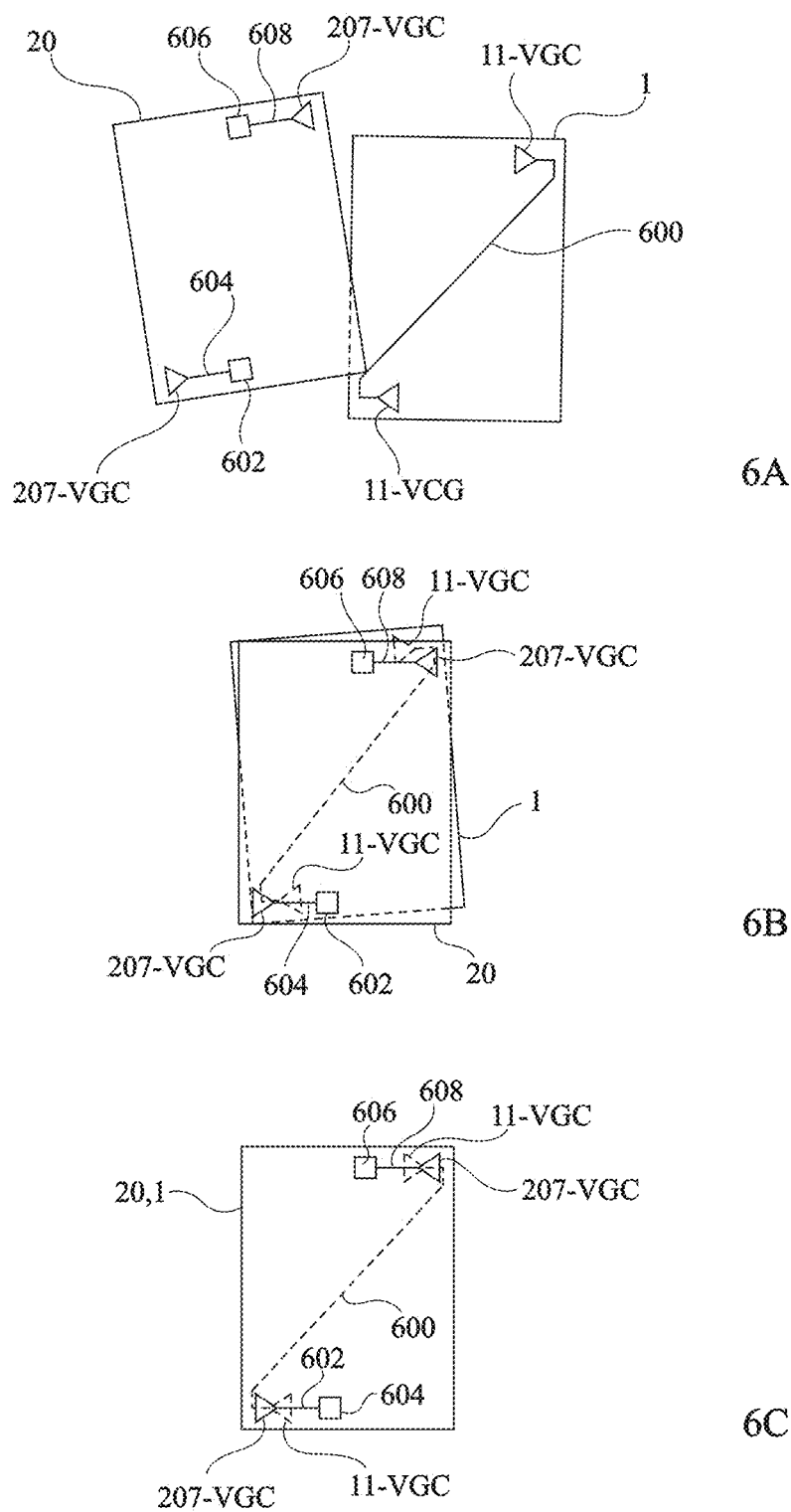
FIG. 6 illustrates an embodiment of a step of the method of FIG. 5.

FIG. 6 illustrates an embodiment of step 502 of the method of FIG. 5. More particularly, FIG. 6 shows top views 6A, 6B, and 6C of chip 20 arranged above chip 20 arranged above circuit 1, these views illustrating successive steps of step 502.

In this embodiment, it is provided for circuit 1 to comprise a waveguide 600 and a port 11-VGC at each of the ends of waveguide 600. Preferably, ports 11-VGC optically connected to waveguide 600 are arranged in opposite corners of circuit 1. It is further provided for chip 20 to comprise two optical ports 207 intended to be optically coupled to ports 11-VGC. One of the two ports 207 is an output port of chip 20, the other being an input port of chip 20. In this example, the output port is a port 207-VGC optically connected to a laser 602 of chip 20 by a waveguide 604 of chip 20, the input port being a port 207-VGC optically connected to a photodiode 606 of chip 20 by a waveguide 608 of chip 20.

At the step illustrated by view 6A of FIG. 6, chip 20 and circuit 1 are not aligned and ports 207-VGC are not aligned with the corresponding ports 11-VGC.

At the next step, illustrated by view 6B of FIG. 6, a rough alignment has been performed, for example, by aligning the edges of chip 20 or of board 22 with a mark of wafer 10 comprising circuit 1, so that an optical coupling is established between ports 207 and ports 11-VGC. The establishing of such an optical coupling may for example be detected when output port 207 delivers an optical signal to the corresponding port 11-VGC and when input port 207 receives an optical signal from the corresponding port 11-VGC. As an example, for a coupling to be detectable, the distance between the two surfaces 201 and 13 is shorter than or equal to 100 µm, or even shorter than 50 µm. Such a distance is sufficient to enable to displace with respect to each other chip 20 and circuit 1 in directions parallel to surfaces 201 and 13, and possibly in rotation around an axis orthogonal to surfaces 201 and 13, without for micropillars 202, possibly provided with material 203, to be in contact with surface 13.

At the next step illustrated by view 6C of FIG. 6, a fine alignment has been performed, by displacing chip 20 and circuit 1 with respect to each other to maximize the optical power received by input port 207 of chip 20, and more particularly to maximize the optical power transmitted, via circuit 1, from output port 207-VGC of chip 20 to input port 207-VGC of the chip. The alignment is then completed.

It should be noted that the step of rough alignment described in relation with view 6B of FIG. 6 and possibly the step of fine alignment of view 6C of FIG. 6 may be omitted during repetitions of step 502. For example, during the repetition of step 502, rather than repeating the steps described in relation with FIG. 6, step 502 is carried out by the displacing of chip 20 and wafer 10 with respect to each other in and over known directions and distances corresponding to the offset between two circuits 1. It may then be provided for a single circuit 1 of wafer 10 to be of the type described in relation with FIG. 6, or a circuit 1 dedicated to step 502 such as described in relation with FIG. 6 may be even provided.

Although circuit 1 and chip 20 are shown in FIG. 6 as having the same dimensions, the method described in relation with FIG. 6 also applies to the case where they have different dimensions.

The implementation of the embodiments described in relation with FIGS. 1 to 6 enables to obtain a positioning of the ports 207 and of the micropillars 202 of chip 20 respectively relative to ports 11 and to pads 12 of circuit 1 with an accuracy of less than 2 µm, or even of less than 1 µm.

Various embodiments and variations have been described. Those skilled in the art will understand that certain features of these various embodiments and variations may be combined, and other variations will occur to those skilled in the art. In particular, although the case where a circuit 1 corresponds, once wafer 10 has been sawn, to an integrated photonic circuit chip, what has been described applies to the case where circuit 1 corresponds to a plurality of photonic circuits, so that once the wafer has been sawn, a plurality of integrated photonic circuit chips are obtained from a same circuit 1. The simultaneous testing of a plurality of integrated photonic circuits by means of a single chip 20 enables to decrease the time necessary to test all the photonic circuits of wafer 10.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for testing a photonic circuit forming part of a semiconductor wafer, the device comprising a photonic test chip, the photonic test chip comprising a first surface configured to be placed opposite to a surface of the photonic circuit when testing the photonic circuit, the photonic test chip further comprising on the side of the first surface of the chip:
   micropillars, each intended to be placed in contact with a corresponding electric connection pad of the photonic circuit when testing the photonic circuit, the electric connection pads being arranged on the side of said surface of the photonic circuit; and
   first optical input/output ports, each intended to be optically coupled to a second corresponding optical input/output port of the photonic circuit when testing the photonic circuit, the second optical input/output ports being arranged on the side of said surface of the photonic circuit.

2. The device of claim 1, wherein a first vertical grating coupler forms one of the first ports.

3. The device of claim 2, wherein said first coupler is intended to be optically coupled to a second vertical grating coupler forming one of the second ports.

4. The device of claim 1, wherein the micropillars have a height in the range from 5 to 20 µm, preferably identical for all the micropillars.

5. The device of claim 1, further comprising a test station, the test station comprising:
   a mobile table intended to receive the semiconductor wafer; and
   a mobile arm intended to support the test chip.

6. The device of claim 1, wherein the test chip comprises a source of a light signal.

7. The device of claim 6, wherein the light source is optically coupled to at least one of the first ports via at least one waveguide of said test chip.

8. The device of claim 1, wherein each of the first ports and of the second ports is a vertical grating coupler, a vertical illumination photodiode, or a vertical cavity surface-emitting laser diode.

9. The device of claim 1, wherein the test chip comprises electric connection pads on the side of a second surface opposite to the first surface, and electrically-conductive through vias electrically coupling the micropillars to said pads.

10. The device of claim 9, further comprising a printed circuit board arranged on the side of the second surface of the test chip, the printed circuit board being electrically connected to the pads of the test chip.

11. The device of claim 1, comprising a processing circuit configured to deliver electric test signals and to receive electric signals representative of the result of the test.

12. The device of claim 11, wherein the test chip comprises the processing circuit.

13. The device of claim 10, comprising an electronic chip comprising the processing circuit, wherein said electronic chip is interposed between the second surface of the test chip and the printed circuit board and is electrically connected to the pads of the test chip, or wherein said electronic chip is assembled on the printed circuit board and is coupled to the pads of the test chip via the printed circuit board.

14. The device of claim 1, wherein the first ports and the micropillars are arranged based on the positions of the second ports and of the connection pads of the photonic circuit, so that when the micropillars are in contact with the pads of the photonic circuit, the first ports are optically coupled to the second ports.

15. The device of claim 1, wherein the micropillars have a diameter in the range from 5 to 20 µm, and are preferably coated with a resilient material such as gold.

16. A method comprising the steps of:
   a) providing the test device of claim 1 and a photonic circuit to be tested with said device, the photonic circuit comprising a second output port and a second input port connected to the respective ends of a waveguide of the photonic circuit, the test chip comprising a first output port intended to be optically coupled to the second input port and a first input port intended to be coupled to the second output port;
   b) placing the first surface of the test chip opposite a surface of the photonic circuit having the second ports arranged on its side; and
   c) maximizing a quantity of light transmitted from the first output port to the first input portion via the second input port, the waveguide, and the second output port.

17. The method of claim 16, further comprising, between steps b) and c), a step of making the first surface of the chip and said surface of the photonic circuit parallel.

18. The device of claim 11, comprising an electronic chip comprising the processing circuit, wherein said electronic chip is interposed between the second surface of the test chip and the printed circuit board and is electrically connected to the pads of the test chip, or wherein said electronic chip is assembled on the printed circuit board and is coupled to the pads of the test chip via the printed circuit board.

* * * * *